United States Patent [19]

Iwase et al.

[11] Patent Number: 5,475,639

[45] Date of Patent: Dec. 12, 1995

[54] SEMICONDUCTOR MEMORY DEVICE WITH IMPROVED SPEED FOR READING DATA

[75] Inventors: Akihiro Iwase; Teruo Seki; Shinji Nagai; Tadashi Ozawa, all of Kasugai, Japan

[73] Assignees: Fujitsu Limited, Kawasaki; Fujitsu VLSI Limited, Kasugai, both of Japan

[21] Appl. No.: 215,023

[22] Filed: Mar. 21, 1994

[30] Foreign Application Priority Data

Jun. 10, 1993 [JP] Japan ..................... 5-138797

[51] Int. Cl.⁶ ........................... G11C 7/00
[52] U.S. Cl. ............... 365/189.11; 365/190; 365/203; 365/208
[58] Field of Search ................. 365/189.11, 190, 365/203, 207, 208, 189.09

[56] References Cited

U.S. PATENT DOCUMENTS

| | | | |
|---|---|---|---|
| 4,062,000 | 12/1977 | Donnelly | 365/203 |
| 4,888,737 | 12/1989 | Sato | 365/203 |
| 5,058,072 | 10/1991 | Kashimura | 365/189.11 X |
| 5,126,974 | 6/1992 | Sasaki | 365/207 |
| 5,199,000 | 3/1993 | Takahashi | 365/189.11 X |
| 5,253,137 | 10/1993 | Seevinck | 365/230.01 |

FOREIGN PATENT DOCUMENTS 0389989  10/1990  European Pat. Off. .
61-278098  12/1986  Japan .
63-261597  10/1988  Japan .
1-192078  8/1989  Japan .

*Primary Examiner*—David C. Nelms
*Assistant Examiner*—Son Mai
*Attorney, Agent, or Firm*—Nikaido, Marmelstein, Murray & Oram

[57] ABSTRACT

Disclosed is a semiconductor memory device which operates based on voltages from a high voltage power source and a low voltage power source. A plurality of memory cells are formed in a memory cell array. Plural pairs of bit lines are connected to the memory cells to transfer data signals read from the memory cells. A sense amplifier, which has a pair of input terminals, amplifies the data signal. A level shifter is selectively connected to plural pairs of bit lines to shift the level of the data signal of a selected pair of bit lines to a level near the operation point of the sense amplifier, and supplies a resultant data signal to the sense amplifier. The level shifter includes a first transistor for receiving the data signal, and a plurality of second transistors connected between the first transistor and the low voltage power source. The first transistor has a first terminal to be supplied with the data signal, a second terminal and a control electrode for receiving a control signal for transferring the data signal to the sense amplifier. The second transistors are connected between the second terminal of the first transistor and the low voltage power source. The output of the second terminal of the first transistor is input to the input terminals of the sense amplifier.

9 Claims, 6 Drawing Sheets

5,475,639

SEMICONDUCTOR MEMORY DEVICE WITH IMPROVED SPEED FOR READING DATA

BACKGROUND OF THE INVENTION

1. Field of the Invention

The present invention relates to a semiconductor memory device. More particularly, this invention relates to a static RAM (SRAM) in which bit lines and data lines, sharing common bit lines, (pairs of common data lines) are precharged to a predetermined voltage level.

2. Description of the Related Art

In the conventional SRAM, data read from a memory cell is transferred to a sense amplifier via a pair of bit lines and a pair of common data lines. The data is then amplified by the sense amplifier. The sense amplifier operates most efficiently when the voltage level of the data read from the memory cell is at a voltage level intermediate to that of the power source. To facilitate this, conventional SRAMs incorporate circuitry to shift the voltage level of the data read from the memory cells to an intermediate level. A level shifter suitable for such a sense amplifier is proposed in Japanese Unexamined Patent Publication No. Hei 1-192078. This level shifter is illustrated in FIG. 1.

A memory cell array 101 shown in FIG. 1 has plural pairs of word lines WL0 and plural pairs of bit lines. FIG. 1 shows only one pair of bit lines BL0 and /BL0. A memory cell C0 is connected between each word line and an associated pair of bit lines. Each cell C0 comprises cell transistors T41 and T42 and gate transistors T43 and T44, with resistors R11 and R12 as their loads, The resistor R11 and the transistor T41 are connected in series, and the resistor R12 and the transistor T42 are connected in series, the former series circuit being connected in parallel to the latter one between a power source $V_{DD}$ and ground $V_{SS}$. When any one of the word lines and an associated pair of bit lines are selected, the cell connected to the selected word line and pair of bit lines is selected. Data in that cell is then read onto the pair of bit lines.

Connected to each pair of bit lines BL0 and /BL0 is a bit equalizer 102 for precharging that pair of bit lines. The equalizer 102 utlizies PMOS transistor T45, T46 and T47.

A pair of common data lines LD0 and /LD0 are respectively connected to each pair of bit lines BL0 and /BL0 via column switches 103 and 104. The switch 103 comprises a PMOS transistor T48 and an NMOS transistor T49, and the switch 104 comprises a PMOS transistor T50 and an NMOS transistor T51. A signal which is a column selection signal CD inverted by an inverter 105 is input to the gates of the transistors T48 and T50, and the column selection signal CD is input to the gates of the transistors T49 and T51. When the column selection signal CD goes high, the switches 103 and 104 are turned on, causing the pair of bit lines BL0 and /BL0 to communicate with the pair of common data lines LD0 and /LD0 respectively.

A common equalizer 106 is connected to the pair of common data lines LD0 and /LD0 to precharge those common data lines. The equalizer 106 comprises PMOS transistors T52, T53 and T54.

A sense amplifier 108 is connected via a level shifter 107 to the pair of common data lines LD0 and /LD0. The level shifter 107 comprises NMOS transistors T55 to T59 and PMOS transistors T60 and T61. The transistors T55 and T56 have their drains connected to the power source $V_{DD}$, and their gates respectively connected to the common data lines LD0 and /LD0. The sources of the transistors T55 and T56 are connected to the drains of the transistors T57 and T58. The gates of the transistors T57 and T58 are connected to the drain of the transistor T57, thus constituting a current mirror circuit. The sources of the transistors T60 and T61 are connected to the power source $V_{DD}$. The transistors T60 and T61 have their drains respectively connected to the drains of the transistors T57 and T58 and their gates respectively connected to the drains of the transistors T58 and T57. The sources of the transistors T57 and T58 are connected to the ground $V_{SS}$ via the transistor T59. This transistor T59 is activated when the common data lines LD0 and /LD0 are selected.

The sense amplifier 108 is connected to a node N1 between the transistors T55 and T57 via a signal line LS0 and to a node N2 between the transistors T56 and T58 via a signal line/LS0. The sense amplifier 108 is constituted of a differential amplifier which amplifies the differential voltage between the signal lines LS0 and /LS0 and outputs the amplified data.

In the thus constituted SRAM, an activate signal φ0 is set to an L level before data is read out. Consequently, the individual transistors T45 to T47 are turned on, and the pair of bit lines BL0 and /BL0 are precharged by the power source $V_{DD}$. Further, the individual transistors T52 to T54 are turned on, and the pair of data lines LD0 and /LD0 are precharged by the power source $V_{DD}$.

When the activate signal φ0 goes high in response to a change made in an address signal, the transistors T45 to T47 and T52 to T54 are turned off, terminating the precharging of bit lines BL0 and /BL0 and data lines LD0 and /LD0.

When the column selection signal CD goes high, the column switches 103 and 104 are turned on, connecting the pair of bit lines BL0 and /BL0 to the pair of data lines LD0 and /LD0. This allows word line WL0 together with the corresponding word and bits lines to be selected. When data in the cell C0 is "1" at this time, the transistor T41 is turned off and the transistor T42 is turned on. This causes both a high level signal to be read onto the bit line BL0 and low level signal to be read onto the bit line /BL0. These signals are transferred to the level shifter 107 via the pair of data lines LD0 and /LD0. As a result, the conductance of the transistor T55 becomes small while the conductance of the transistor T56 becomes large. Consequently, the voltage level of the signal line LS0 becomes slightly higher than $V_{DD}/2$ while the voltage level of the signal line/LS0 becomes slightly lower than $V_{DD}/2$, as shown in FIG. 7. The levels of the signal lines LS0 and /LS0 are amplified by the sense amplifier 108 and read data DR is output.

The level shifter 107 in the SRAM shifts the voltage levels of the signals which travel through the pair of data lines LD0 and /LD0 and outputs the resultant signals to the sense amplifier 108. To accurately read data from the cell C0, therefore, it is necessary to precharge the pair of bit lines BL0 and /BL0 and pair of data lines LD0 and /LD0.

Due to the recent improvement on the reading speed of SRAMs, the precharging time for the pair of bit lines BL0 and /BL0 and pair of data lines LD0 and /LD0 has become shorter. To shorten the precharging time, it is necessary to increase the current values of the precharging elements (the transistors T45 to T47 of the equalizer 102 and the transistors T52 to T54 of the equalizer 106), or increase the current value of the data transfer elements (the transistors T55 and T56 of the level shifter 107). This requires that the area of those elements occupying on the semiconductor substrate be increased.

With the recent high integration of SRAMs, however, there is a limit to the area available with which to form the precharging elements or the data transfer elements. It is therefore as yet, remained a challenge to precharge the associated pair of nodes of the level shifter and a pair of bit lines completely to the same voltage level. Moreover, it takes time to accomplish such precharging. With larger precharged areas, the precharge takes longer, and this also interferes with the improvement on the reading speed.

SUMMARY OF THE INVENTION

It is therefore an object of the present invention to provide a semiconductor memory device which will overcome the abovedescribed shortcomings and which has an improved reading speed without compromising the integration level of the semiconductor memory device.

To achieve this object, according to the present invention, there is provided a semiconductor memory device operable based on voltages from a high voltage power source and a low voltage power source comprising a plurality of memory cells formed in a memory cell array; a plural pairs of bit lines, connected to the memory cells, for transferring data signals read from the memory cells; a sense amplifier having a pair of input terminals for receiving a data signal of each pair of bit lines, for amplifying the data signal thereof; and a level shifter to which the plural pairs of bit lines are selectively connected, and which shifts a level of the data signal of a selected pair of bit lines to a level in a vicinity of the operational range of the sense amplifier. The level shifter further supplies a resultant data signal to the sense amplifier, and includes a first transistor for receiving the data signal and a first terminal to be supplied with the data signal, a second terminal and a control electrode for receiving a control signal for transferring the data signal to the sense amplifier, an output of the second terminal being input to the input terminals of the sense amplifier, and a plurality of second transistors connected between the second terminal of the first transistor and the low voltage power source.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DESCRIPTION OF THE PREFERRED EMBODIMENT

An SRAM according to a preferred embodiment of the present invention will now be described with reference to FIGS. 2 through 7.

Figure 1:
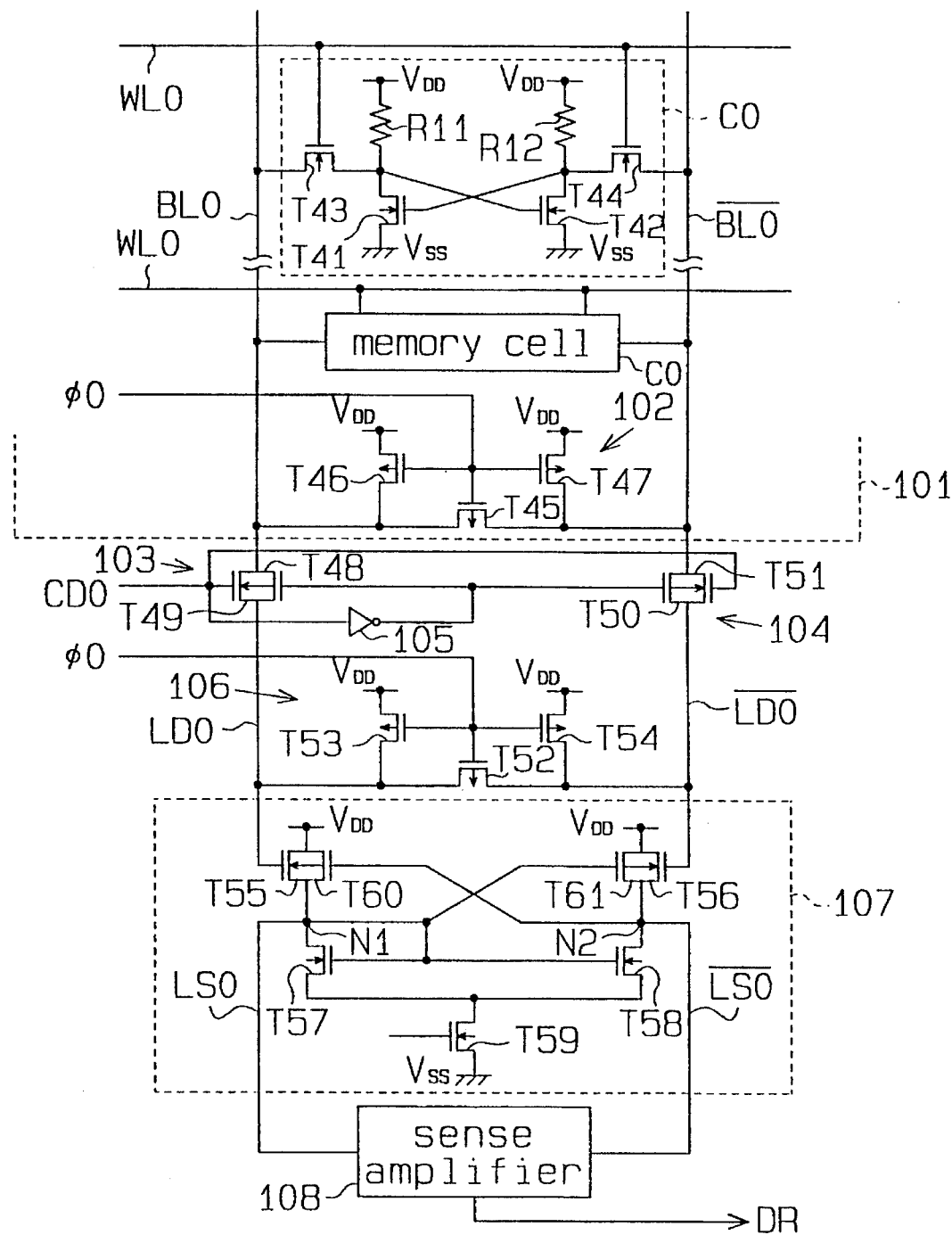
FIG. 1 is a circuit diagram illustrating a memory cell array and a level shifter of a conventional SRAM.
Figure 2:
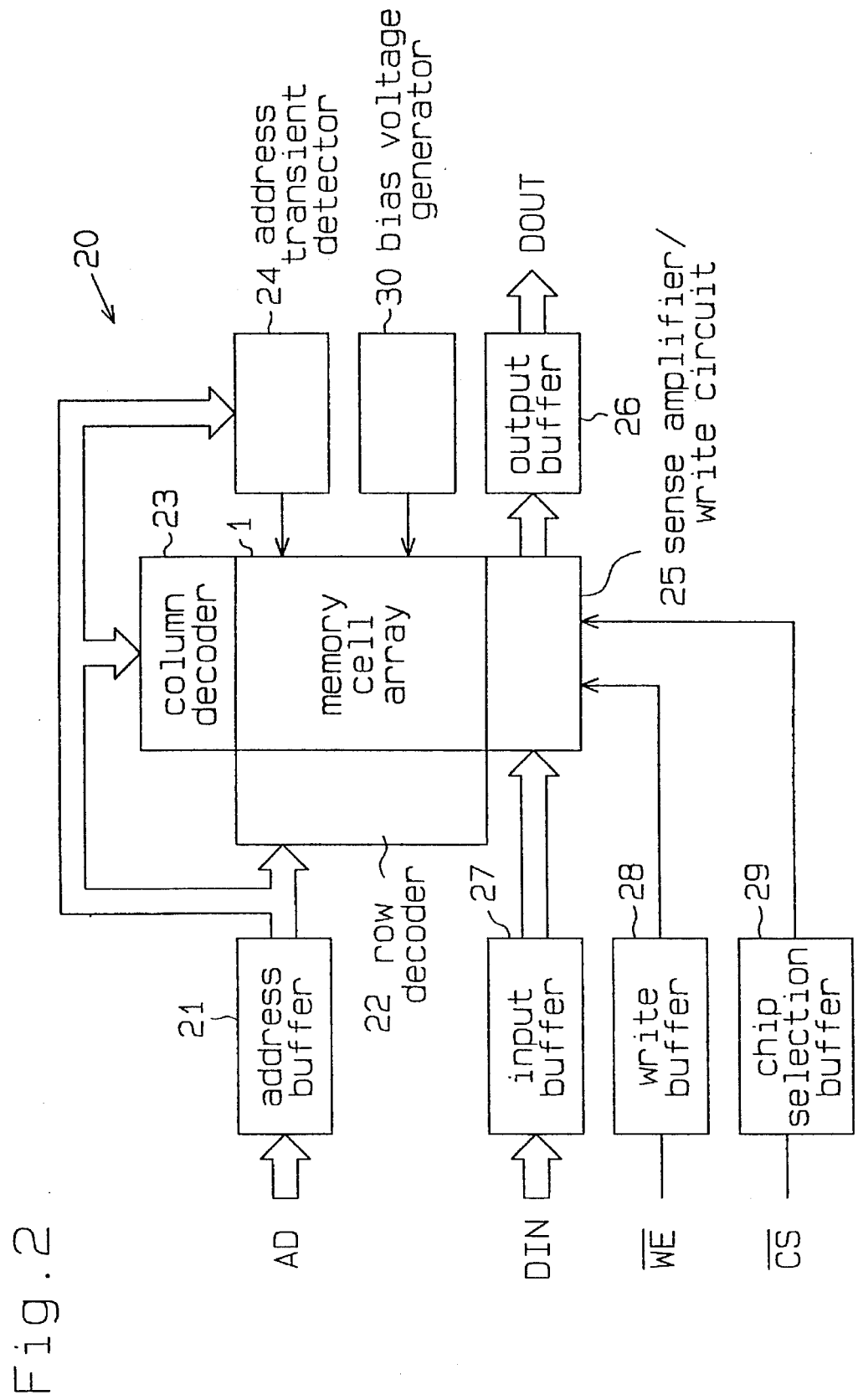
FIG. 2 is a block diagram showing an SRAM according to one embodiment of the present invention.

As shown in FIG. 2, an SRAM 20 has a memory cell array 1, an address buffer 21, a row decoder 22, a column decoder 23 and an address transient detector 24. The SRAM 20 further includes a sense amplifier/write circuit 25, an output buffer 26, an input buffer 27, a write buffer 28, a chip selection buffer 29 and a bias voltage generator 30. The sense amplifier/write circuit 25 comprises a sense amplifier 25A and a write circuit 25B shown in FIG. 3.

The structures and actions of the individual circuits mentioned above will now be described one after another.

The address buffer 21 receives an address signal AD consisting of n bits (n: natural number) from a controller (not shown). The buffer 21 supplies the received address signal AD to the decoders 22 and 23. The SRAM 20 is supplied with power from a high voltage power source $V_{DD}$ and power from a ground $V_{SS}$ as a low voltage power source, and functions based on the powers from both power sources $V_{DD}$ and $V_{SS}$.

The row decoder 22 decodes the address signal AD into a selection signal to select a predetermined word line of the memory cell array 1. The column decoder 23 likewise decodes the address signal AD into a selection signal to select a predetermined pair of bit lines of the memory cell array 1. In the memory cell array 1, therefore, a memory cell which is connected to the selected word line and the selected pair of bit lines will be selected.

The sense amplifier/write circuit 25 is connected to the memory cell array 1, and the output buffer 26 and the input buffer 27 are connected to this circuit 25.

The input buffer 27 receives data DIN consisting of a plurality of bits (n bits in this embodiment) from the controller (not shown). The input buffer 27 outputs the data DIN to the sense amplifier/write circuit 25. The write buffer 28 receives a write enable signal /WE and outputs this signal /WE to the sense amplifier/write circuit 25. The chip selection buffer 29 receives a control signal /CS and outputs this control signal /CS to the sense amplifier/write circuit 25.

When the write enable signal /WE and the control signal /CS are both low, the sense amplifier/write circuit 25 writes the data DIN to the selected memory cell in the memory cell array 1. When the write enable signal /WE is high and the control signal /CS is low, the sense amplifier/write circuit 25 reads data from the selected memory cell in the memory cell array 1 and outputs the read data DOUT via the output buffer 26.

The voltage generator 30 generates a bias voltage lower than the ground potential $V_{SS}$ based on the source voltage $V_{DD}$ which is externally supplied. The voltage generator 30 supplies the bias voltage to the back gates of NMOS transistors included in the SRAM 20.

Figure 4:
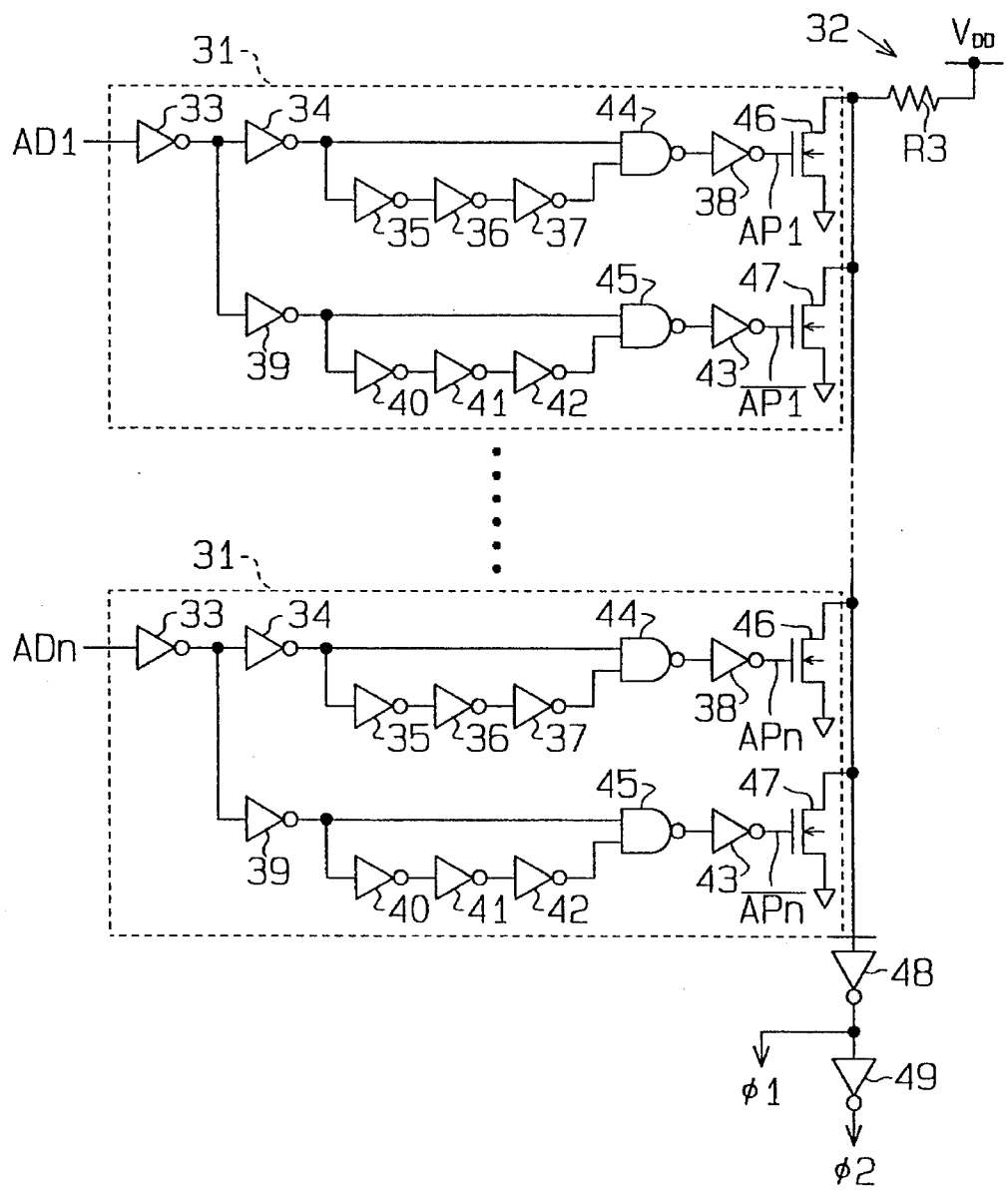
FIG. 4 is a circuit diagram showing a circuit for detecting an address transition in the SRAM in FIG. 2.
Figure 5:
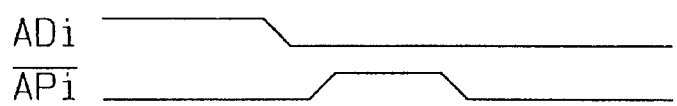
FIGS. 5A and 5B are waveform diagrams illustrating the operation of the address transient detector in FIG. 4.
Figure 5:

FIG. 4 presents the detailed illustration of the address transient detector 24. This detector 24 comprises n bit transient detecting sections 31, which respectively detect changes in individual bit signals AD1 to ADn forming address signal AD, and an output circuit section 32. The detector 24 outputs activate signals φ1 and φ2 based on a change in each of the bit signals AD1 to ADn.

More specifically, the output circuit section 32 comprises a resistor R3 and inverters 48 and 49, all connected in series to the power source $V_{DD}$. The inverter 48 outputs the activate signal φ1, and the inverter 49 outputs the activate signal φ2 which is the activate signal φ1 inverted.

Each bit transient detecting section 31 of the detector 24 comprises a plurality of inverters 33 to 43, a pair of NAND gates 44 and 45 and a pair of NMOS transistors 46 and 47. The transistors 46 and 47 are connected in parallel to the resistor R3. The output of the inverter 33 is input to the inverters 34 and 39. The output of the inverter 34 is input to a first input terminal of the NAND gate 44 directly and is also input to a second input terminal of the NAND gate 44 via the inverters 35, 36 and 37. The output of the inverter 39 is input to a first input terminal of the NAND gate 45 directly and is also input to a second input terminal of the NAND gate 45 via the inverters 40, 41 and 42. The outputs of the NAND gates 44 and 45 are respectively input to the gates of the transistors 46 and 47. The individual inverters 33 receive the bit signals AD1 to ADn, respectively.

If none of the bit signals AD1 to ADn, ADi (i: 1 to n), changes, therefore, output signals APi and /APi of the inverters 38 and 43 go low as is apparent from FIGS. 5A and 5B. As a result, the transistors 46 and 47 are turned off, allowing a low level activate signal φ1 and a high level activate signal φ2 to be output.

If the level of any one of the bit signals AD1 to ADn changes to an L level from an H level, on the other hand, the output signal /APi of the inverter 43 of the associated bit transient detection section 31 goes high for a predetermined period of time as shown in FIG. 5A. As a result, the associated transistor 47 is turned on, permitting a high level activate signal φ1 and a low level activate signal φ2 to be output.

If the level of any one of the bit signals AD1 to ADn changes from a low to a high level, the output signal APi of the inverter 38 of the associated bit transient detection section 31 goes high for a predetermined period of time as shown in FIG. 5B. As a result, the associated transistor 46 is turned on, permitting the high level activate signal φ1 and the L-level activate signal φ2 to be output.

Figure 3:
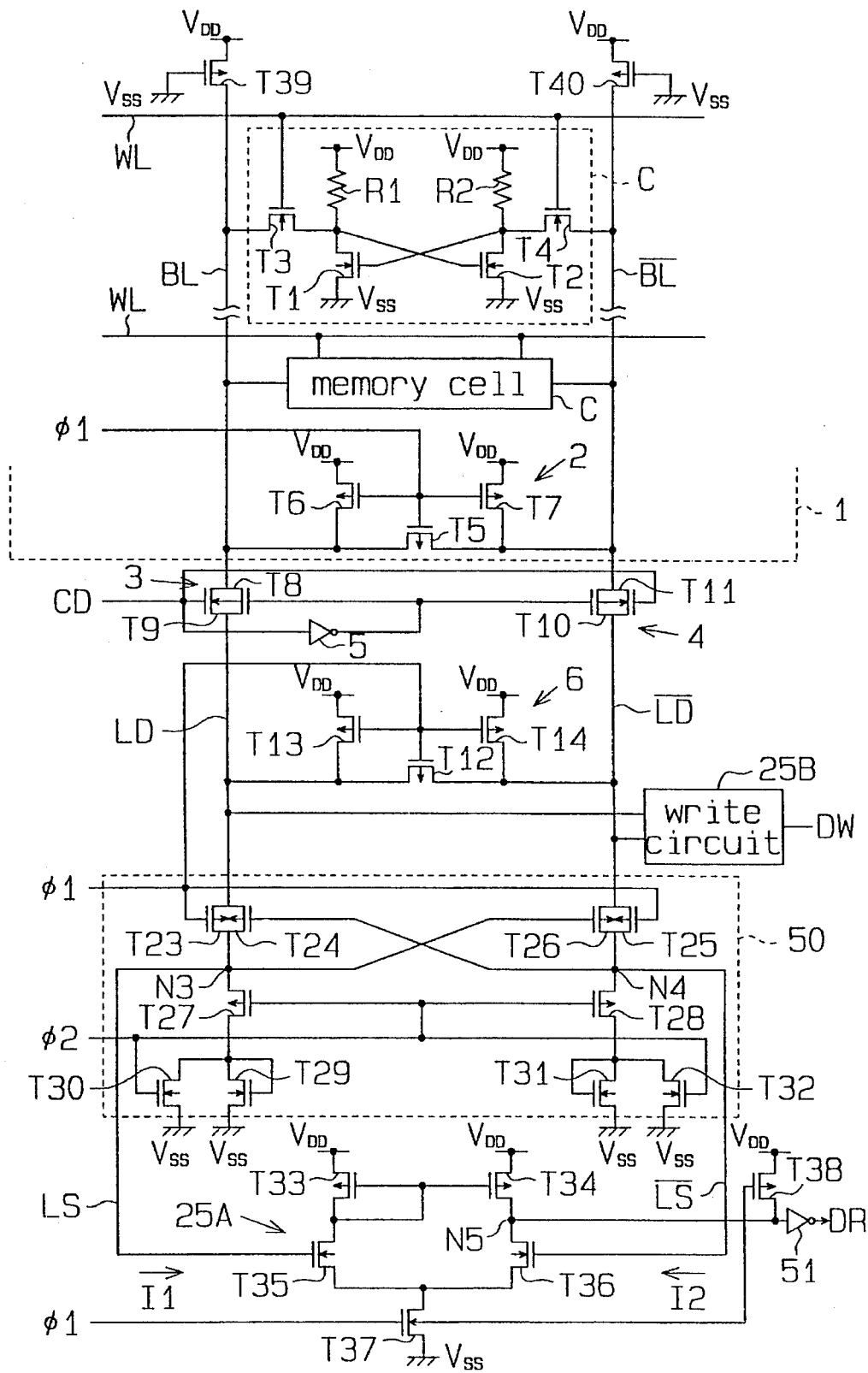
FIG. 3 is a circuit diagram showing a memory cell array and a level shifter of the SRAM in FIG. 2.

The details of the memory cell array 1 will now be given. The memory cell array 1 shown in FIG. 3 is provided with a plurality of word lines WL running horizontally and plural pairs of bit lines running vertically. FIG. 3 shows only one pair of bit lines BL and /BL. The pair of bit lines BL and /BL are respectively connected to the drains of the PMOS transistors T39 and T40 whose sources are connected to the power source $V_{DD}$. The gates of the transistors T39 and T40 are connected to the ground $V_{SS}$.

A memory cell C is connected to each word line and between each pair of bit lines. Each cell C comprises a pair of cell transistors T1 and T2 and a pair of gate transistors T3 and T4, with resistors R1 and R2 of large resistances as their loads. The resistor R1 and the transistor T1 are connected in series, and the resistor R2 and the transistor T2 are connected in series, the former series circuit being connected in parallel to the latter one between the power source $V_{DD}$ and the ground $V_{SS}$. The gate of the cell transistor T1 is connected to the drain of the other cell transistor T2, while the gate of the cell transistor T2 is connected to the drain of the cell transistor T1. When a word line and a pair of bit lines are selected based on the address signal, the memory cell, which is connected to the selected word line and pair of bit lines, is selected.

Connected to each pair of bit lines BL and /BL is a bit equalizer 2 which comprises PMOS transistors T5, T6 and T7. The transistor T5 has its source and drain connected to the respective bit lines of the associated bit line pair, and has its gate supplied with the activate signal φ1. The transistors T6 and T7 have their sources connected to the power source $V_{DD}$ and their drains connected respectively to the source and drain of the transistor T5. The activate signal 61 is input to the gates of the transistors T6 and T7.

When the activate signal φ1 is at an L level or when this pair of bit lines are not selected, the transistors T5 to T7 are turned on, causing the pair of bit lines to be precharged by the power source $V_{DD}$.

Further, a pair of common data lines LD and /LD are respectively connected to each pair of bit lines BL and /BL via column switches 3 and 4, each comprising a transmission gate. The switch 3 utilizes a PMOS transistor T8 and an NMOS transistor T9. Switch 4 utilizes a PMOS transistor T10 and an NMOS transistor T11. A signal which is a column selection signal CD inverted by an inverter 5 is input to the gates of the transistors T8 and T10, and the column selection signal CD is input to the gates of the transistors T9 and T11.

When the column selection signal goes high the switches 3 and 4 are turned on and connect the pair of bit lines BL and /BL to the pair of common data lines LD and /LD respectively.

A common equalizer 6 is connected to the pair of common data lines LD and /LD. The equalizer 6 comprises PMOS transistors T12 to T14. The PMOS transistor T12 has its source and drain respectively connected to the pair of data lines LD and /LD and has its gate supplied with the activate signal φ1. The PMOS transistors T13 and T14 have their sources connected to the power source $V_{DD}$ and their drains respectively connected to the source and drain of the PMOS transistor T12. The activate signal φ1 is input to the gates of the PMOS transistors T13 and T14.

When the activate signal φ1 is at an L level or when this pair of data lines are not selected, the transistors T12 to T14 are turned on, causing the pair of data lines to be precharged by the power source $V_{DD}$.

The sense amplifier 25A is connected via a level shifter 50 to the pair of data lines LD and /LD. The level shifter 50 comprises PMOS transistors T23 to T28 and NMOS transistors T29 to T32.

The sources of the transistors T23 and T24 are both connected to the data line LD while the sources of the transistors T25 and T26 are both connected to the data line /LD. The drains of the transistors T23 and T24 are both connected to the source of the transistor T27, while the drains of the transistors T25 and T26 are both connected to the source of the transistor T28. The activate signal φ1 is input to the gates of the transistors T23 and T25. The gates of the transistors T24 and T26 are respectively connected to the sources of the transistors T28 and T27. The activate signal φ2 is input to the gates of the transistors T27 and T28.

The drains of the transistors T29 and T30 are connected to the drain of the transistor T27, while the drains of the transistors T31 and T32 are connected to the drain of the transistor T28. The sources of the transistors T29, T30, T31 and T32 are all connected to the ground $V_{SS}$. The transistor T29 has its gate connected to its drain, and the transistor T31 has its gate connected to its drain. The activate signal φ2 is input to the gates of the transistors T30 and T32. At the time of data reading, the transistors T29 and T31 act to set the potential levels at nodes N3 and N4 to near a half of the level of the voltage of the power source $V_{DD}$, based on a threshold value VthN. The transistors T24, T27 and T29 connected to the data line LD constitute a direct current path for the sense amplifier 25A. The transistors T26, T28 and T31 connected to the data line /LD likewise constitute a direct current path for the sense amplifier 25A.

A description will now be given of the sense amplifier 25A with reference to FIG. 3.

The sense amplifier 25A is connected to the nodes N3 and N4 via the signal lines LS and /LS. The PMOS transistors T33 and T34 of the sense amplifier 25A have their sources connected to the power source $V_{DD}$ and their gates connected to the drain of the transistor T33, thus constituting a current mirror circuit. The drains of the transistors T33 and T34 are respectively connected to the drains of the NMOS transistors T35 and T36 whose sources are also connected together.

The transistors T35 and T36 have their gates respectively connected to the signal lines LS and /LS and their sources both connected via the NMOS transistor T37 to the ground $V_{SS}$. The activate signal $\phi 1$ is input to the gate of the transistor T37.

An inverter 51 is connected to a node N5 between the transistors T34 and T36 so that read data DR is output from the inverter 51. The PMOS transistor T38 is connected between the node N5 and the power source $V_{DD}$, with the activate signal $\phi 1$ input to its gate. When either the activate signal $\phi 1$ is at an L level or when no data is read out, the transistor T38 is turned on to set the read data DR to an L level regardless of the output of the sense amplifier 25A. When the activate signal $\phi 1$ is at an H level or when data is to be read out, the transistor T38 is turned off to permit the output of the sense amplifier 25A to be output as the read data DR.

Figure 6:
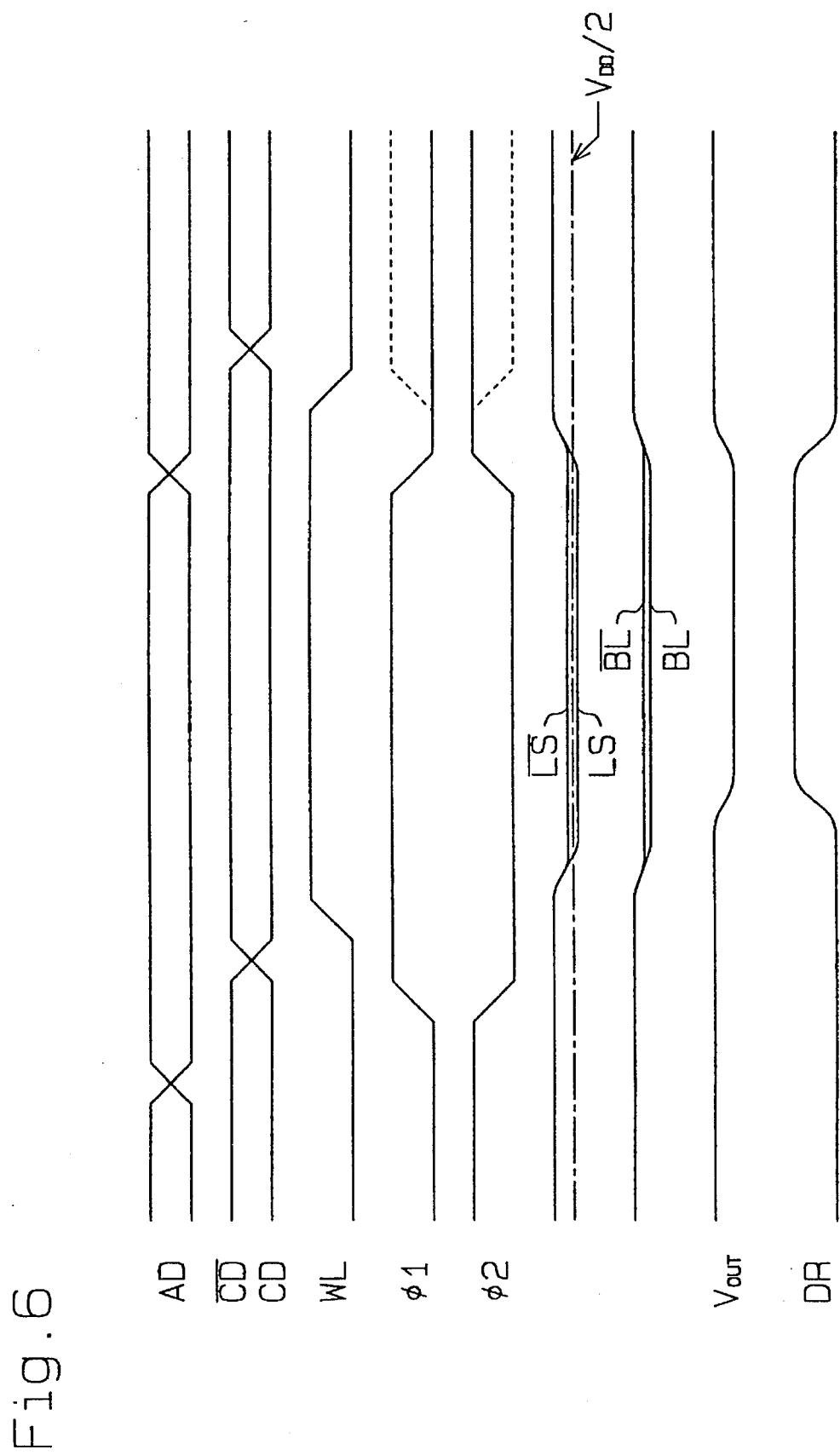
FIG. 6 is a time chart illustrating an operation for reading data from the SRAM in FIG. 2.

The general operation of the SRAM 20 having the above-described structure will be discussed below with reference to FIG. 6.

While the address signal remains unchanged, the activate signal $\phi 1$ is kept at an L level. Therefore, the individual PMOS transistors T5 to T7 are turned on, causing the pair of bit lines BL and /BL to be precharged by the power source $V_{DD}$. The PMOS transistors T12 to T14 are also turned on to permit the pair of data lines LD and /LD to be precharged by the power source $V_{DD}$. When the activate signal $\phi 1$ goes low, the transistors T23 and T24 turn on and the potentials at the nodes N3 and N4 match that of the power source $V_{DD}$. Since the activate signal $\phi 2$ becomes an H level at this time due to the action of the inverter 49, the transistors T27 and T28 are turned off and the transistors T30 and T32 are turned on.

When a change occurs in the address signal AD, the activate signal $\phi 1$ goes high and the transistors T5 to T7 and T12 to T14 are turned off, ending the precharging of the pair of bit lines BL and /BL and the pair of common data lines LD and /LD. When the level of the activate signal $\phi 1$ is high, the transistors T23 and T24 are off. Since the level of the activate signal $\phi 2$ becomes an L level at this time due to the action of the inverter 49, the transistors T27 and T28 are turned on and the transistors T30 and T32 are turned off.

When the column selection signal CD goes high, column switches 3 and 4 turn on allowing a connection to be made between the pair of bit lines BL and /BL and the pair of data lines LD and /LD. When any word line WL is selected next, the gate transistors T3 and T4 of the memory cell C which is connected to that word line WL are turned on to read out data from the memory cell C.

When the data in the memory cell C is "1" at this time, the cell transistor T1 is turned off and the cell transistor T2 is turned on, setting the bit line BL to an H level and the bit line /BL to an L level. Accordingly, the current from the transistor T39 will not flow into the memory cell C but is entirely supplied to the level shifter 50. The current from the transistor T40 is separated into the current which flows to the cell transistor T2 via the gate transistor T4 and the current which flows to the level shifter 50.

Figure 7:
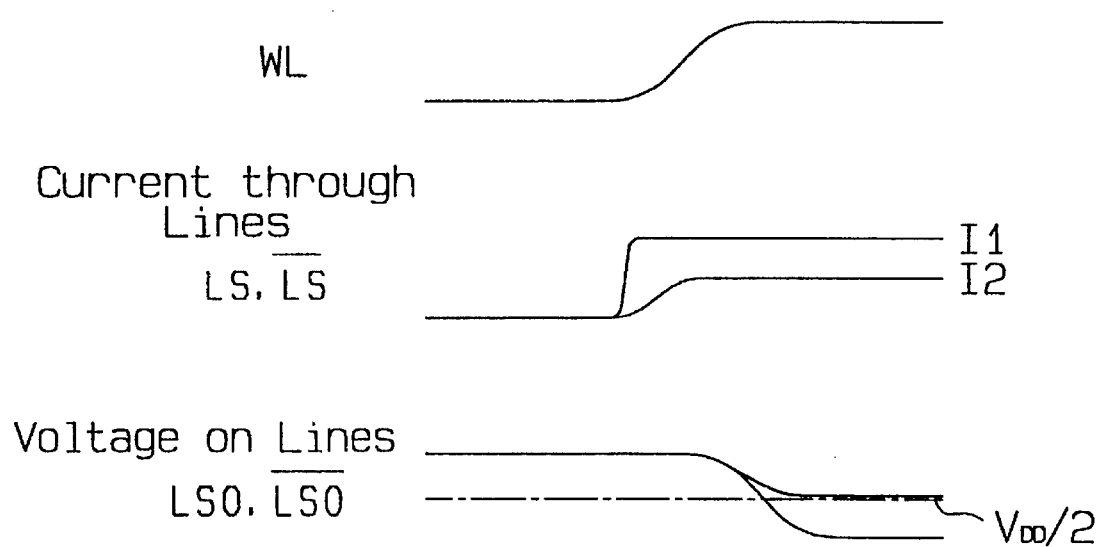
FIG. 7 is an exemplary diagram for comparing the operation of the level shifter in FIG. 3 with the operation of the level shifter of the prior art.

Therefore, changes in the amounts of the currents respectively flowing through the transistors T24 and T26 or the amounts of currents I1 and I2 flowing on the signal lines LS and /LS appear immediately both after a change has been made to the level of the word line WL, and after the currents become I1 >I2 as shown in FIG. 7. Consequently, the potential level at the node N3 becomes slightly higher than $V_{22}/2$ while the potential level at the node N4 becomes slightly lower than $V_{DD}/2$. The voltages at the nodes N3 and N4 are given to the sense amplifier 25A. The potential levels at the node N3 and N4 are amplified by the sense amplifier 25A, and the read data DR is then output from the sense amplifier 25A.

According to this embodiment, as described above, the transistors T24, T27 and T29 in the level shifter 50 are connected in series to the data line LD, and the transistors T26, T28 and T31 are connected in series to the data line /LD, thereby forming DC current paths. The currents which flow through both DC current paths are supplied to the sense amplifier 25A. The amplifying action of the sense amplifier 25A is accomplished based on the difference between the amounts of the currents supplied via both DC current paths to the sense amplifier 25A, regardless of the voltage levels of the bit lines BL and /BL. According to the prior art, however, when the voltage levels of the bit lines BL0 and /BL0 are established based on the data of a selected memory cell, the level shifter 107 functions and the potential levels at the nodes N1 and N2 are determined by the voltage levels of the bit lines BL0 and /BL0. The conventional sense amplifier 108 accomplishes the amplifying action based on the potential levels at the nodes N1 and N2.

According to the present invention, therefore, currents will be supplied via both DC current paths to the sense amplifier 25A even if the time for precharging the pair of bit lines BL and /BL and the pair of data lines LD and /LD is shortened or even if precharging of those bit and data lines is not performed. This accomplishes the amplifying operation of the sense amplifier 25A quickly, thus improving the speed for reading data.

Due to the same reasons, even if any data, having once been read, remains on any of the pair of bit lines BL and /BL or the pair of data lines LD and /LD or at the nodes N3 and N4 in the level shifter 50, the previous data will be erased quickly by the currents flowing through both DC current paths before the current data reading operations are carried out. In this manner, the speed of the current data reading can be increased.

Since each of the NMOS transistors T29 and T31 has the gate and drain connected together in this embodiment, the output level of the level shifter 50 can be set to near a half of the potential level of the power source $V_{DD}$ in accordance with the threshold value VthN. It is therefore possible to further improve the speed to perform the amplifying operation of the sense amplifier 25A.

Although only one embodiment of the present invention has been described herein, it should be apparent to those skilled in the art that the present invention may be embodied in many other specific forms without departing from the spirit or scope of the invention. Particularly, it should be understood that the following modification may be employed.

For example, although the transistors T39 and T40 are provided to supply currents to the bit lines BL and /BL in this embodiment, conductive elements which are turned on only at the time of data reading may be provided instead.

Therefore, the present example and embodiment are to be considered as illustrative and not restrictive and the invention is not to be limited to the details given herein, but may be modified within the scope of the appended claims.

What is claimed is:

1. A semiconductor memory device operable based on voltages from a high voltage power source and a low voltage power source comprising:

a plurality of memory cells formed in a memory cell array;

a plurality of pairs of bit lines, connected to said memory cells, for communicating data signals read from said memory cells;

a sense amplifier, coupled to said plurality of pairs of bit lines, having a pair of input terminals for receiving a data signal and for amplifying said data signal; and a level shifter to which said plurality of pairs of bit lines are selectively connected, said level shifter operating to shift a level of said data signal of a selected pair of bit lines to a level in a vicinity of an operation point of said sense amplifier and which supplies a resultant data signal to said sense amplifier, said level shifter comprising, a first transistor for receiving said data signal and having a first terminal to be supplied with said data signal, a second terminal, and a control electrode for receiving a control signal in order to transfer said data signal to the input terminals of said sense amplifier and said second terminal, and a plurality of second transistors connected between said second terminal of said first transistor and said low voltage power source, wherein said second terminal of the first transistor outputs the signal to the sense amplifier.

2. A semiconductor memory device according to claim 1, wherein at least one of said second transistors is an N channel MOS transistor which has a gate and a drain connected together.

3. A semiconductor memory device according to claim 2, wherein said memory cells each comprises:

first and second resistors; and first and second cell transistors respectively connected to said first and second resistors, said first resistor and said first cell transistor being connected in series between said high voltage power source and said low voltage power source, said second resistor and said second cell transistor being connected in series between said high voltage power source and said low voltage power source, said first cell transistor having a gate connected to a drain of said second cell transistor, the gate of which is connected to a drain of said first cell transistor.

4. A semiconductor memory device according to claim 3, further comprising:

an equalizer connected to each pair of said plurality of pairs of bit lines for precharging said each pair of bit lines; and a plurality of third transistors connected between each bit line of said plurality of pairs of bit lines and said low voltage power source, said third transistors having nodes connected to said low voltage power source, and said third transistors precharging said nodes in cooperation with said equalizer.

5. A semiconductor memory device according to claim 4, further comprising:

a pair of data lines commonly provided for said plurality of pairs of bit lines and connected to said first terminal of said first transistor; and an equalizer connected to said pair of data lines for precharging said pair of data lines.

6. A semiconductor memory device according to claim 1, wherein each pair of said plurality of pairs of bit lines are further connected to at least two additional transistors, said at least two additional transistors supplying said bit lines with a level shifter potential setting current in response to a high voltage from said high voltage power source.

7. A semiconductor memory device according to claim 1, wherein said first transistor is provided for each bit line of said plurality of pairs of bit lines, the control electrode of said first transistor provided for one bit line of one of said plurality of pairs of bit lines is coupled to the second terminal of said first transistor provided for the other bit line of said pair of bit lines, and the control electrode of said first transistor provided for the other of said pair of bit lines is coupled to the second terminal of said first transistor provided for said one of said pair of bit lines.

8. A semiconductor memory device according to claim 1, wherein said plurality of said second transistors include a plurality of pairs of transistors connected in parallel with each other, each of said pairs of transistors being connected in series and has a node connected thereto, and said node is discharged by means of a fourth transistor coupled thereto.

9. A semiconductor memory device according to claim 1, wherein at least one of said second transistors is an N channel MOS transistor which has a gate receiving a control signal to cease a current supply to said second transistors when said level shifter is not activated.

* * * * *